United States Patent [19]

Wong

[11] Patent Number: 5,251,173
[45] Date of Patent: Oct. 5, 1993

[54] HIGH-SPEED, LOW DC POWER, PNP-LOADED WORD LINE DECORDER/DRIVER CIRCUIT

[75] Inventor: Joseph Y. Wong, Wappingers Falls, N.Y.

[73] Assignee: International Business Machines Corporation, Armonk, N.Y.

[21] Appl. No.: 651,680

[22] Filed: Feb. 6, 1991

[51] Int. Cl.$^5$ .............................................. G11C 7/00
[52] U.S. Cl. ........................ 365/189.110; 365/230.06
[58] Field of Search ...................... 365/189.11, 230.06, 365/204, 225.6

[56] References Cited

U.S. PATENT DOCUMENTS

| | | | |
|---|---|---|---|
| 3,513,330 | 5/1970 | Berney | 307/225 |
| 3,621,299 | 11/1971 | Barber | 307/273 |
| 3,742,258 | 6/1973 | Clark | 307/273 |
| 3,819,955 | 6/1974 | Hilbert | 307/255 R |
| 4,031,413 | 6/1977 | Ohhinata et al. | 307/238 |
| 4,198,578 | 4/1980 | Ozawa et al. | 307/246 |
| 4,288,862 | 9/1981 | Ohhinata et al. | 365/181 |
| 4,596,002 | 6/1986 | Csn et al. | 365/230.06 |
| 4,613,767 | 9/1986 | Holland | 307/288 |
| 5,109,167 | 4/1992 | Montegari | 365/230.06 |

OTHER PUBLICATIONS

IBM Technicial Disclosure Bulletin vol. 30, No. 6—Nov. 1987.
IBM Technical Disclosure Bulletin vol. 29, No. 8—Jan. 1987.
Odaka et al., High Speed BICMOS SRAM, Abstract No. 276.
Miyaoko, et al., Session XI: East SRAMs, IEEE International Solid State Circuits Conference, Feb. 26, 1987.
Chan et al., SCR Pull14 up Circuit, IBM Technical Disclosure Bulletin, vol. 26, No. 10A, Mar. 1984.
Berger et al., Merged Transistor Logic with Power Driver, IBM Technical Disclosure Bulletin, vol. 15, No. 5, Oct., 1972.

Primary Examiner—Eugene R. LaRoche
Assistant Examiner—Tan Nguyen
Attorney, Agent, or Firm—Whitham & Marhoefer

[57] ABSTRACT

Active pull-up circuits for a memory decoder/driver circuit allow standby current in the decoder/driver circuit to be reduced to a low level consistent with high switching speed. A resistor in series with the selection transistors is shunted by an active device when a word line is selected, allowing the resistor to be given a high, current limiting value to reduce power consumed by the decoder/driver circuit when the word line is deselected. The base of the word line selection transistor has a bleed resistor shunted by a feedback transistor of a complementary type to the word line selection transistor, forming a fast switching circuit having positive feedback path. A Darlington connected pull up circuit is also provided in parallel with the feedback transistor which further enhances switching speed. The circuit formed by the word line selection transistor and the feedback resistor are connected in a manner, using a Schottky diode, to stabilize the word line voltage against variations in $V_{cc}$ and the gain, $\beta$, of the word line selecting transistors. An arrangement is also provided to enhance deselection speed by discharging the base node of the word line driving transistor. This decoder/driver arrangement is particularly advantageous where the memory is comprised of cells of the Harper PNP type which exhibit a low soft error rate even at low standby currents.

14 Claims, 5 Drawing Sheets

HIGH-SPEED, LOW DC POWER, PNP-LOADED WORD LINE DECORDER/DRIVER CIRCUIT

BACKGROUND OF THE INVENTION

1. Field of the Invention

The present invention generally relates to electronic memories and, more particularly, to decoder/driver circuits for static memories utilizing the Harper PNP cell.

2. Description of the Prior Art

Electronic memory circuits have been known for many years. Such memory circuits have employed a wide variety of types of circuits and circuit elements in order to store information in some way, such as by storage of charge in a capacitive element or the use of a bistable circuit or element. Such a bistable element can take the form, for example, of the well-known flip-flop circuit, where a pair of transistors are cross-coupled in such a way that when one transistor is turned on, the other will be forced off, or a magnetizable core or other element or domain which can be selectively magnetized into one of at least two distinct states.

Each of these memory types, categorized by the type of memory cell employed, has distinct advantages and disadvantages with respect to the other types of memory and each type will typically be applied where the advantages can be best utilized. In particular, static random access memories using bistable circuits constructed from bipolar transistors are typically used in cache memories and central processing units due to their characteristically high speed. The access cycle times of such devices can be as short as 3 ns, or more than an order of magnitude faster than dynamic RAMs, due largely to their lack of need for refresh and inherently faster operation of sense amplifiers since detection of data in a bistable circuit of a static RAM is far easier than detection of a minuscule amount of electrical charge in a capacitive memory cell of a dynamic RAM.

While static RAMs use many more circuit elements per storage cell than dynamic RAMs and are therefore limited to a smaller number of storage cells possible on a chip of a given size, increased numbers of storage cells present some problems in design due to the fact that a typical storage cell will have a circuit including at least a pair of cross-coupled transistors, one of which will be conductive at any given time. Reduction in average cell standby current through the conductive transistor of each cell typically increases susceptibility of the cell to soft errors, due, for instance, to disruption of charge distribution caused by alpha particles.

Figure 1A:
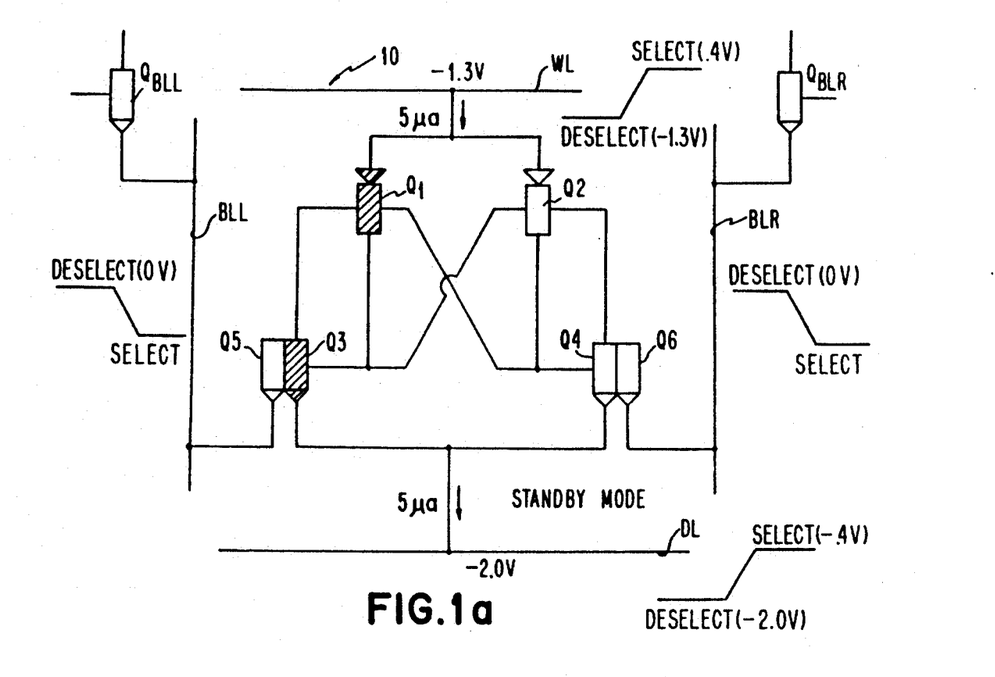
FIGS. 1a, 1b and 1c are circuit diagrams of a typical Harper PNP cell in standby mode, read mode and write mode, respectively.
Figure 1B:
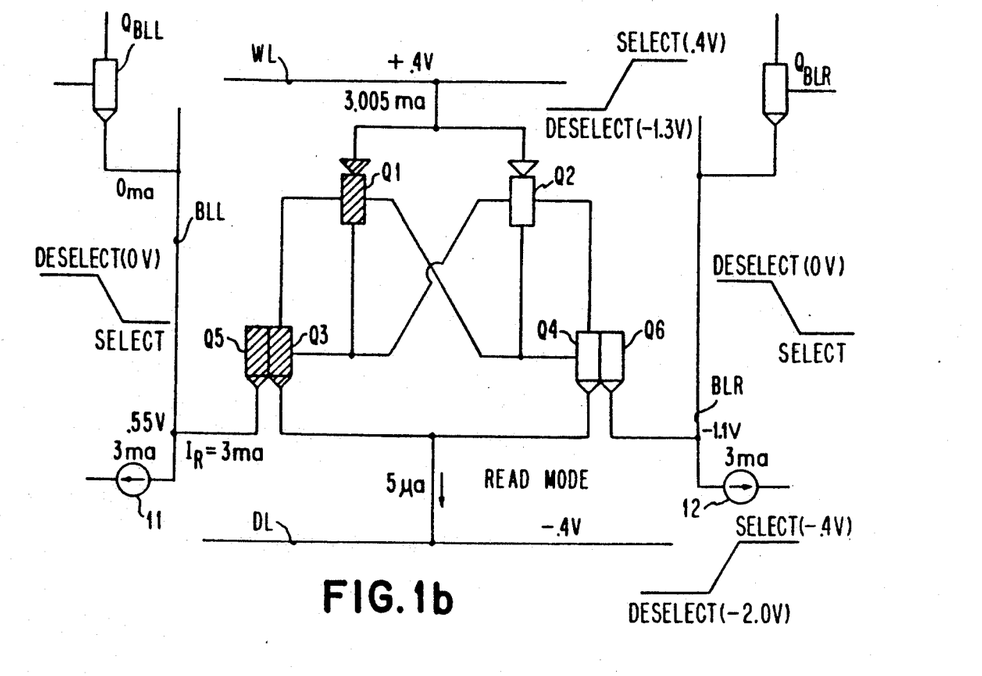
Figure 1C:
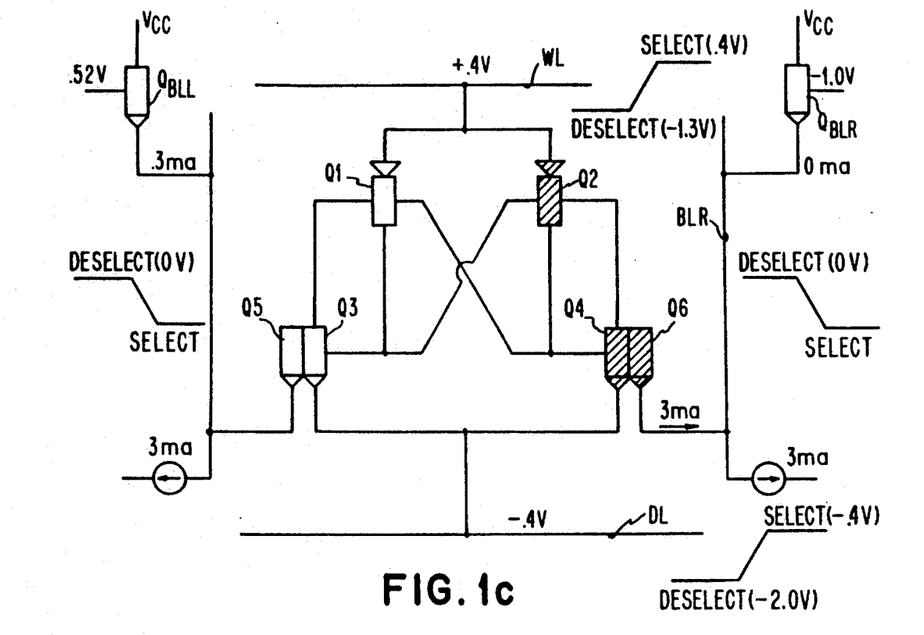

One particularly successful memory cell circuit design is the Harper PNP cell, illustrated in FIGS. 1a–1c. One advantage of the Harper PNP cell is that the standby current can be reduced to about 5 microamperes per cell and still result in a reasonable soft error rate. This feature is provided with a very simple and compact circuit which can be integrated at high density on the memory chip. The compactness results from the fact that it includes two cross-coupled pairs of transistors, each of which includes a PNP transistor and NPN transistor. The two transistors of each pair can be merged to form a PNPN silicon controlled rectifier (SCR) device. The operation of this circuit will be described in more detail below.

In recent years, there has been an interest in increasing the memory capacity of all types of memory devices, including static memory devices. Some particular problems are encountered in doing so in static RAMs because the size of each memory cell on the chip is much larger than in dynamic RAMs due to the use of a greater number of circuit elements in each memory cell. While the problem is of greater complexity than is relevant to an understanding of the present invention, the basic elements of the problem concern word line resistance and capacitance.

Word line capacitance is generally a function of word line length and increased capacitance tends to slow the switching function of the word line driver used for selection. Increased word line length can also increase susceptibility to noise. Therefore, there is a practical limit on the length of the word lines which may be employed, limiting the number of cells which can physically be placed along that length.

Bistable static memory cells also inherently draw current over the word lines regardless of the data stored therein, due to the nature of the bistable circuit operation. While this current can be reduced to low levels during deselected operation, possible voltage drops along the word line during both selected and deselected operation is not negligible and must be considered during memory device design.

For these reasons, the number of cells which can be attached to a given word line or lines associated with a single word line driver is typically limited to 128 or 256 cells. Since selection of memory cells for a write or read operation in any RAM is a joint function of both word lines and bit lines, static RAMs cannot be expanded by increasing the number of bit lines beyond the practical limit imposed by the number of cells which can be driven by a single word line driver. Therefore, any increase in memory capacity must be accompanied by a directly proportional increase in the number of word line drivers.

The word line drivers also typically perform a decoding function and, for this reason, are often referred to as word line decoder/drivers. Typically, the circuit providing the decoding function will include a plurality of parallel connected transistors to which address signals are applied. One or more of these input transistors will be conductive at all times except when the cell is selected for a read or write operation. A resistor is placed in series with the collectors of these parallel connected input transistors in order to develop a voltage which is then used to control the transistors driving the word line. While the resistance of this series resistor might be increased to limit current through the input transistors during deselected periods, such a possibility is limited by the fact that the resistor must also supply the base current for the word line driver circuit when the driver is selected and the fact that increase of resistor value will decrease the voltage swing available when the driver is switched from a deselected state to a selected state or vice-versa. Reduction of this voltage swing also tends to decrease noise margins and increase susceptibility to errors due to electrical noise. Increase of this resistance also tends to decrease switching speed.

The use of a fixed resistor causes some further problems since, as indicated above, the resistor must supply the base current for the word line driver transistors. As a practical matter, the word line driver transistors are subject to variations in gain, $\beta$, due to unavoidable variations in the manufacturing process consistent with economy and good device yield. Since a fixed resistor can only supply a fixed base current to the word line driver transistors during selection periods, the variations in $\beta$ of the word line driver transistors may result in significant difference in the current and voltage applied to the memory cells during write and read operations, thus potentially reducing operational and noise margins of the memory device.

Further, to reduce word line length, word line driver circuits are usually placed in a central location on the chip and a node connecting the base nodes of a plurality of word line driver transistors is formed. This node will have a capacitance which is not negligible and the time constant associated with this capacitance and the series input resistance will reduce switching speed for a given capacitance of the node if the resistance is large.

Also, a fixed resistance does not allow for either the word line or the base node of the word line driver transistors to be clamped to a power supply voltage without saturation of the word line driver transistors or transistors in the input circuit, respectively. This design consideration imposes a trade-off between noise immunity and switching speed. For this reason, it is often necessary to provide some voltage regulation means to assure adequate performance of the memory device.

Because the series resistor is subject to these conflicting design constraints, practical word line drivers typically draw a greater current and consume more power than the memory cells to which they are connected. For this reason, when the memory capacity is made large with a proportionate increase in the number of word line drivers, the power consumed by the drivers for, say, a static RAM of 128K capacity (which would thus have a minimum of 512 or 1024 word line drivers), even in the standby or deselected state, can reach a value in excess of 40% of the total power consumed by the memory device. This amount of power consumption leads to problems of heat dissipation and may require expensive cooling arrangements to be provided. Even if the problem of heat dissipation could be satisfactorily and economically solved, the prior art does not provide any means of avoiding the trade-off between power consumption and performance, particularly in the areas of speed and noise immunity. In this regard, it is to be understood that while these problems are especially critical in static RAMs, the same problems are also encountered in other types of memory devices, as well.

Therefore, a need exists in the prior art to provide a circuit which will allow standby power to be reduced in a word line driver circuit for a memory while maintaining or improving switching speed and noise immunity.

SUMMARY OF THE INVENTION

It is therefore an object of the present invention to provide a driver circuit for a word line of a memory device using Harper PNP cells including an active pull-up circuit.

It is another object of the invention to provide a push-pull word line driver circuit which can provide select and deselect operations of a static memory at increased speed and noise immunity at reduced power levels.

It is a further object of the invention to provide a non-linear pull up circuit which will allow separation of the design considerations of power consumption (e.g. DC or steady state power requirements) and fast transient response (e.g. AC switching speed).

It is a yet further object of the invention to provide a word line driver circuit in which currents and voltages are clamped to power supply voltages to improve noise immunity without saturation of transistors in the driver circuit.

It is yet another object of the invention to provide a switching circuit in which rapid discharging of the base node capacitance of the switching transistor is accomplished.

In order to satisfy the above and other objects of the invention, a word line driver circuit for a memory device is provided having a standby current limiting resistor connected between a power source and a base electrode of a word line driver transistor, in which the word line driver circuit includes at least one active pull up circuit means for shunting said current limiting resistor.

In accordance with another aspect of the invention, a word line driver circuit for a memory device is provided having at least one word line driving bipolar transistor of a first conductivity type which has an emitter electrode connected to a word line of the memory device, a collector electrode and a base electrode and a standby power limiting resistor connected between a power source and the base electrode, in which the word line driver circuit includes an active pull up circuit means shunting said standby power limiting resistor which is conductive when the word line driving bipolar transistor is conductive.

In accordance with a further aspect of the invention, a switching circuit is provided comprising a first bipolar transistor of a first conductivity type having an emitter electrode forming an output of said switching circuit, a base electrode forming an input of said switching circuit and a collector electrode, a resistor connecting the collector electrode of the first bipolar transistor to a power source, a second bipolar transistor of a second conductivity type having an emitter electrode connected to the power source, a collector electrode connected to the input of the switching circuit and a base electrode connected to a node between the first bipolar transistor and the resistor, and a diode connected between the input of the switching circuit and the emitter electrode of the first bipolar transistor.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Referring now to the drawings, and more particularly to FIG. 1a, a typical Harper PNP cell is shown having an arbitrary "1" stored therein. The Harper PNP cell consists of six devices, $Q_1$–$Q_6$ (subscripts will be used hereinafter to denote transistors in the memory cell, as opposed to the devices in the driver circuit). Transistors $Q_1$–$Q_4$ form the bistable latch circuit of the cell while $Q_5$ and $Q_6$ are input/output devices which connect the latch circuit to the bit lines (BLL, BLR) when the cell is selected and isolates the latch from the bit lines when the cell is deselected. Transistor pairs $Q_1$, $Q_3$ and $Q_2$, $Q_4$ form cross-coupled SCRs and that $Q_1$, $Q_3$ are on, as indicated by shading, while $Q_2$, $Q_4$ are off. The differential voltage at the bases of transistors $Q_3$, $Q_4$ represents a logic state of the circuit which reflects the data stored in the memory cell. Selection voltage transitions are as shown.

Assuming the cell to be in a standby state, $V_{WL} = -1.3v$, $V_{DL} = -2.0v$ and $V_{BLL} = V_{BLR} = 0.0v$. These voltages, particularly the zero bit line voltages yield bias voltages which reverse bias $Q_5$ and $Q_6$ to isolate the cell from the bit lines and no conductivity results through the cell to the bit lines. Note also that only 0.7v is present across the collector-emitter series circuit of the latch transistors. The current in this circuit is thus reduced to a low level but will be greater than the minimum 5 $\mu a$ level, corresponding to a reasonable soft error rate, unless further limited by the driver circuit. This is, in fact, done by RHR, RLR, RHL and RLL, as shown in both FIG. 2 and FIG. 5. The standby cell current can also be limited in other ways, such as providing resistance in the cell. However, such techniques are not important to an understanding of the present invention since, as pointed out above, the invention is directed to reduction of power consumed in the driver itself.

Figure 2:
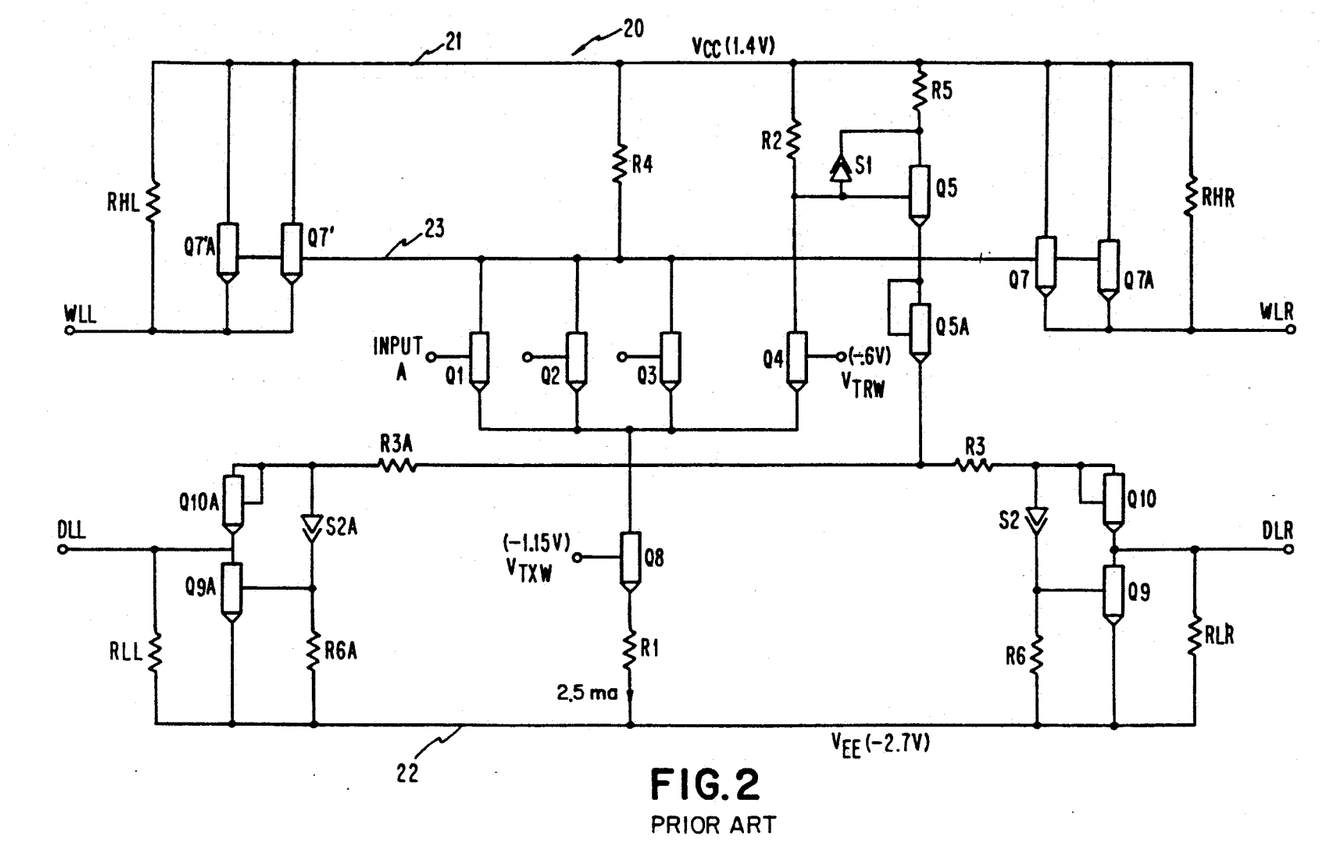
FIG. 2 is a circuit diagram of a prior art decoder/driver circuit usable with the Harper PNP cell and having a passive pull-up circuit.
Figure 5:
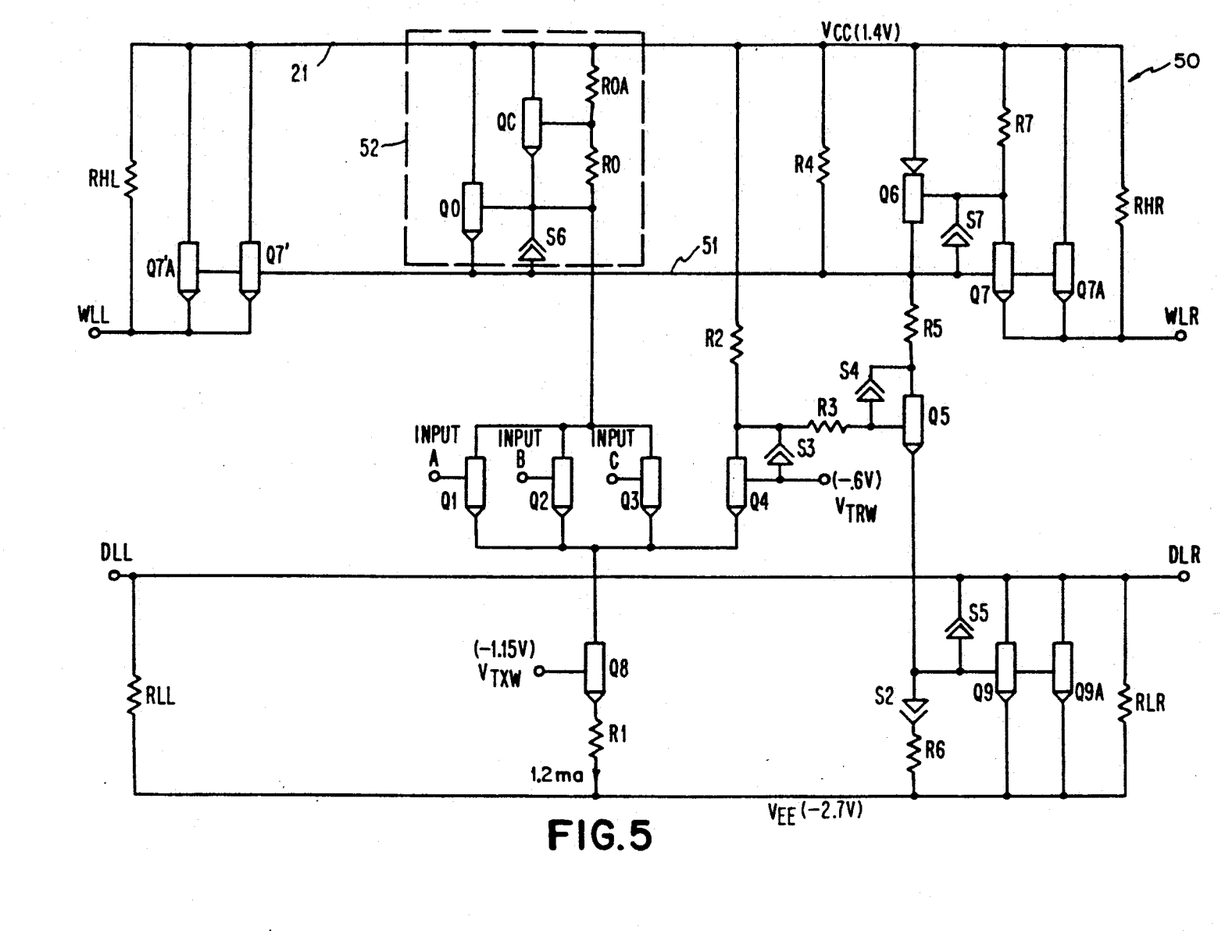
FIG. 5 is a circuit diagram of the decoder driver circuit according to the invention, including the pull-up circuit according to FIG. 4.

Referring now to FIG. 1b, the state of the Harper PNP cell in a selected state during a read operation (read mode) is shown. In the read mode state, $V_{WL} = 0.4v$, $V_{DL} = -0.4v$, $V_{BLL} = -0.55v$ and $V_{BLR} = -1.10v$. Therefore, a bit line differential voltage of approximately 550 mv can be sensed by the sense amplifier of the memory device. The word line/drain line differential voltage is 0.8v even though the voltage swings of each of the word and drain lines is 1.7v and 1.6v, respectively. The sensing is preferably done by drawing a read current from both of the word lines with current sources 11, 12. This read current, $I_R$, of 3 ma is switched into the selected cell by $Q_5$ and supplied by the selected word line's emitter follower transistors Q7, Q7A or Q7', Q7A', as shown in FIGS. 2 or 5. Transistors $Q_{BLL}$ and $Q_{BLR}$, shown in each of FIGS. 1a–1c are included in a bit line read/write control circuit which is otherwise not shown. During the standby state, these transistors are turned off. During the read mode, the transistors are turned on, but no read current, $I_R$, is drawn through $Q_{BLL}$, but is supplied through $Q_5$. $Q_{BLR}$ supplies this current to bit line BLR. The differential bit line voltage of approximately 550 mv is thus developed and sensed by the sense amplifier in the conventional manner.

Referring now to FIG. 1c, a write operation (write mode) of the Harper PNP cell will now be explained. Selection voltages $V_{WL}$ and $V_{DL}$ are the same as when the word line is selected in the read mode. A current is drawn from both bit lines in the same manner as the read mode, as well. To write the cell, however, it is necessary that $Q_5$ be turned off by pulling BLL up to about $-0.3v$ by means of $Q_{BLL}$ by applying a base voltage of 0.52v thereto. Then $Q_6$ is turned on by turning off $Q_{BLR}$ with a base voltage of $-1.0v$. The right bit line BLR is thus drawn down until $Q_6$ turns on to clamp BLR to about $-0.55v$. Once $Q_2$, $Q_4$ and $Q_6$ are turned on in this manner, as shown by shading, the other transistors will be turned off to complete the write operation.

Referring now to FIG. 2, a prior art resistor loaded word line decoder/driver circuit 20 will now be discussed for the purpose of comparison with the decoder/driver circuit of the invention. As is conventional, the word line driver circuit is typically situated centrally on the chip to allow balancing as well as minimization of word line capacitances. Therefore, word line and drain line outputs WLL, WLR, DLL and DLR are provided at both sides of the circuit. Power supply busses 21, 22 are also provided. These busses are connected to the word lines and drain lines by resistors RHL, RHR, RLL and RLR for limiting cell current when the driver circuit and the word line are deselected. These resistors are selectively shunted by transistors Q7', Q7A', Q7, Q7A, Q9A and Q9. Q7', Q7A', Q7 and Q7A are conductive when the driver circuit and word line are selected. Q9A and Q9 are conductive when the driver circuit and word line are deselected. In this manner, the differential voltage across the memory cells is kept relatively constant by providing similar word line and drain line voltage swings. This type of circuit, operating in this manner is generally referred to as a push-pull driver circuit.

Selection of a word line is accomplished by application of a voltage to all of the bases of decoder transistors Q1, Q2 and Q3 such that all of the transistors will be simultaneously turned off. Additional transistors can also be provided as needed to provide selectivity between the number of word lines which exist on the chip. However, it is not necessary, for example, to provide ten such input transistors to provide selectivity between 1024 word line driver circuits since a plural stage decoder would typically be used. Nevertheless, the final stage of any such decoder can be schematically represented by a plurality of parallel transistors, as shown. In the deselected state, at least one of these transistors will be turned on and the bases of the word line emitter follower circuits, connected to node 23, will be pulled down to a voltage established by R4 and transistor Q8 in series with R1. As is well-understood, Q8 and R1 form a current source for transistors Q1, Q2, Q3 and Q4. A bias voltage is applied to Q4 to adjust the switching thresholds of the driver circuit in a manner which is also well-understood.

When the driver is deselected, a substantial current must be drawn through pull-up resistor R4 to provide an adequate voltage swing to the word line emitter followers. R4 must also be kept fairly small to provide adequate base current for Q7, Q7', Q7A and Q7A' when the driver is selected, as indicated above. Therefore, substantial current of about 2.5 ma is drawn by the driver circuit when in a deselected state. Therefore, if 1024 decoder/drivers are provided, over 2.5 amperes of current would be required to satisfy the standby current requirements of the memory device. Since a driver circuit corresponding to FIG. 2 must be provided for each word line of each memory chip, it is seen that this driver circuit causes substantial power to be consumed by the memory even when in a deselected or standby state.

Figure 3:
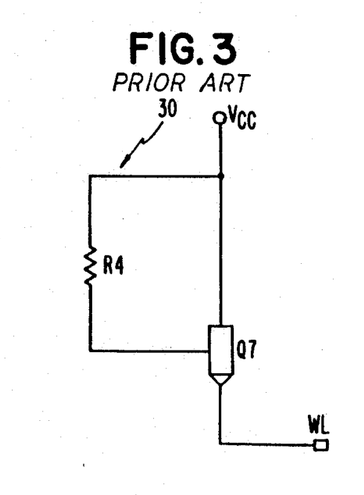
FIG. 3 is a schematic circuit diagram of the pull-up circuit of FIG. 2.

It should also be noted that the base current for transistors Q7, Q7', Q7A and Q7A' is provided only through R4, as shown in the simplified circuit of FIG. 3. Since the gain, $\beta$, of these transistors, illustrated collectively at Q7 of FIG. 3, are subject to substantial manufacturing variation, the stability of word line output current and voltage may also be adversely affected by power supply variations and chip-to-chip manufacturing differences. This is especially true if the resistance of R4 is increased to decrease standby current. Therefore, numerous design constraints must be simultaneously satisfied in the determination of the value of R4, preventing the reduction of standby current consumed by the driver circuit.

Transistors Q5 and Q5A form a phase splitter circuit which controls switching of the drain line transistors Q9, Q10, Q9A and Q10A to establish the push-pull operation of the driver as is well understood in the art and need not be further discussed herein. As with the word line circuit, current in the drain lines and, hence, through the memory cells is also controlled by series resistances RLL and RLR which form a series circuit with the memory cells when Q9 and Q9A are off and the word line is selected Referring now to FIG. 4, the PNP loaded word line driver according to the present invention is shown in simplified form. This circuit is modified from that of prior art FIG. 3, representing a portion of the driver circuit of FIG. 2, by the inclusion of PNP transistor Q6 and resistor R7 which provides a positive feedback signal to the base of Q6 when a voltage is applied to the base of Q7 tending to turn Q7 or. The additional resistance in the collector circuit of Q7 does not affect the driving of the word line since Q7 is paralleled by Q7A which does not have a series resistance. By providing Q6 in parallel with R4, the competing design considerations in the determination of the value of R4 are separated between the selected and deselected states. Therefore, the resistance of R4 can be made large to limit the standby current of the driver. Transistor Q6 also serves the function of clamping the base voltage and providing base current for transistor Q7, resulting in improved reliability of operation and noise immunity as well as manufacturing yield of the memory devices. In regard to manufacture of the memory device, it should be noted that the circuit formed by Q6 and Q7 is similar to the positive feedback circuits such as $Q_1$, $Q_3$ or $Q_2$, $Q_4$ in the Harper PNP cells and, therefore, this circuit can be formed without increasing the number of manufacturing steps for the overall device.

Figure 4:
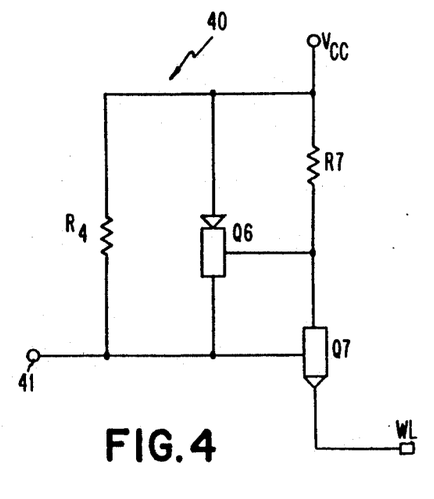
FIG. 4 is a schematic diagram of the pull-up circuit according to the invention.

Referring now to FIG. 5, implementation of the circuit of FIG. 4 in an active PNP loaded word line driver circuit will be discussed, along with some enhancements therefor included in the preferred embodiment of the invention. In FIG. 5, the input circuit, Q1-Q3, threshold circuits Q4, Q8, R1, drive transistors Q7A, Q7A' and current limiting resistors RHL, RHR, RLL and RLR remain as in the driver circuit of FIG. 2. The circuit of FIG. 4 is seen to be connected between the power supply bus 21 and node 51. In the preferred embodiment of the invention, a Schottky diode S7 is also provided between the node to which both the base of Q6 and the collector of Q7 are connected and node 51 to which the collector of Q6 and the base of Q7 are connected. This diode provides a clamping function for the base current of Q7 to counteract the effects of variations in gain of Q7, Q7A, Q7' and Q7A'. Since Q6 directly connects the power supply node 21 and base node 51, it can supply as much current as may be required for a wide range of gains, $\beta$, of the word line drive transistors. Specifically, if $\beta$ is large and less base current is required, the additional current is shunted through the diode S7 to the collector of Q7 and made available to provide current to the word line. If $\beta$ is small, the current is provided to drive the base of Q7 and is also provided to the word line, thereby stabilizing the word line drive current and making it largely independent of the actual value of $\beta$ of Q7 without oversaturation which would otherwise adversely affect switching speed. Also, by virtue of this clamping function, the use of external or internal voltage clamping and/or current regulation is avoided. This function also reduces sensitivity of the word line drive to variations in $V_{cc}$.

Again comparing FIG. 5 with the resistor loaded driver circuit of FIG. 2, it should be noted that the operation of the phase splitter circuit including transistor Q5 is substantially the same but its connection to node 51 and the drain line drive transistors Q9 is altered. Since the application of the circuit of the invention to the driver circuit allows much improved pull up of node 51, the circuit topology can be simplified and Q5 can be connected, through R5, directly to node 51. Now, R2, R3, R4 and R5 all serve to limit emitter current and saturation of Q5 which serves to limit standby current through R6, Q9 and Q9A. Clamping of the drain line to a power supply voltage, $V_{ee}$, is also provided by this direct drive of Q9.

As an enhancement to the operation of the preferred embodiment of the invention, a transient pull up circuit 52 may also advantageously be provided. Resistors R0 and R0A provide biasing for the first transistor stage Qc of a Darlington-connected transistor pair and therefore may be of large resistance. It should be noted that although these resistances are preferably made large, input transistor current limiting is accomplished through transistor Q8 and resistor R1. The input transistors are connected to the node connecting R0 to the base of the second stage of the Darlington pair, Q0, and the input transistors remain effectively connected to node 51 just as they are directly connected to node 23 in FIG. 2. However, when the driver is selected and no current is drawn through the input transistors Q1-Q3, the Darlington pair conducts and provides a rapid pull up of node 51. This causes Q7 to start to conduct and the pull up operation is completed by the positive feedback circuit of Q6. This two-stage pull up operation provides an extremely fast switching action by transistor Q7. However, it should be noted that both the active pull up circuit, preferably constituted by the Darlington pair and the feedback transistor Q6 both parallel the current limiting resistor R4 and that either one of these circuits could be used alone to accomplish the objects of the invention.

It should be noted that when the driver of FIG. 5 is selected, node 51 is only about 170 mv down from $V_{cc}$. Further the $V_{BE}$ multiplier formed by Qc, R0 and R0A is used to clamp the collector voltages of the input transistors Q1-Q3 thus preventing saturation and maintaining high speed performance of these transistors even under worst case conditions.

It should also be noted that the circuit of FIG. 5, when in a deselected condition and the active pull up circuit or circuits are off, is electrically identical to that of FIG. 2 except that, since the design constraints on the value of R4 have been separated, R4 as well as the series connection of R0 and R0A in the circuit of FIG. 5 can be made much larger (preferably by about an order of magnitude) than R4 of FIG. 2; allowing standby current to be significantly reduced.

Further, either of the active pull up circuits (e.g. Q6 or the Darlington connected pair of transistors) in combination with R4 essentially provides a non-linear resistance to accommodate the design requirements of both the selected and deselected states and the enhanced noise immunity provided by the clamping actions of both active pull up circuits is an additional benefit derived without requiring any additional structure.

Additionally, this circuit may be further operationally enhanced by the provision of Schottky diode S6. When any one of input transistors Q1-Q3 becomes conductive, node 51 is rapidly discharged through the input transistor via the Schottky diode S6 to further enhance switching speed during switching from selection to deselection. In this way, low current levels can be maintained in the driver according to the invention without degradation of switching speed performance at either the select/deselect or deselect/select transitions. In this regard, it will be noted by those skilled in the art that the addition of Q6 will increase the capacitance of base node 51. However, the rapid discharging of that node through one or more of the input transistors avoids any effect of the increased capacitance from being reflected in the switching speed performance of the memory device.

Figure 6:
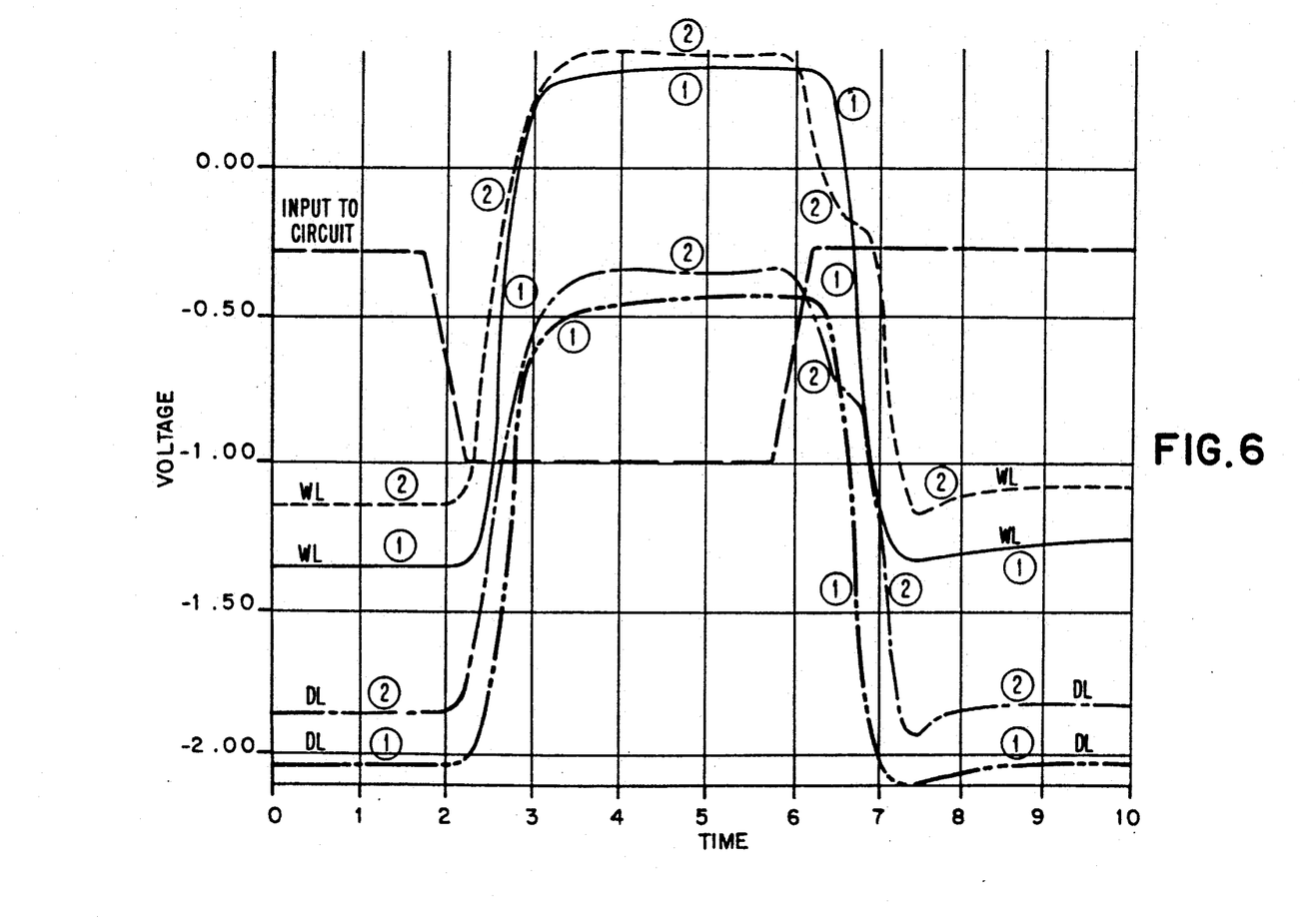
FIG. 6 shows comparative performance of the circuits of FIG. 2 and FIG. 5.

FIG. 6 shows a comparison of the performance of the invention with the related art resistor loaded driver circuit of FIG. 2. The performance of the FIG. 2 circuit is shown by the swings of word line and drain line voltage indicated by the circled numeral 2 and the corresponding curves for the circuit of FIG. 5 are shown by word line and drain line swings indicated by circled numeral 1. It is thus seen that response times are virtually identical for the two circuits but the word and drain line swings for the circuit of FIG. 5 are actually slightly larger even while standby current is greatly reduced. This can also be viewed as an increase in speed for equivalent word line and drain line swings as can be seen from the increased slope of both transitions, as provided by the invention.

Specifically, the performance values of the circuit according to the preferred embodiment of the invention are as follows:

|  | FIG. 2 | FIG. 5 |
| --- | --- | --- |
| deselect DC power | 18 mw | 11 mw |
| word line swing | 1.5 v | 1.7 v |
| W.L. sel. up level | unclamped | clamped |
| Q1-Q3 collectors | unclamped | clamped |

In view of the foregoing, it is seen that the driver circuit according to the invention provides a low standby power, push-pull word line driver circuit without degradation of switching speed which allows the low standby current/soft error immunity of Harper PNP cells to be fully exploited. It should be also understood that the principles of the invention can also be applied to other technologies and circuits for formation of memory cells and the low standby power, high switching speed, noise immunity and word line output stability would continue to be provided, regardless of the type of memory cell which might be used.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A word line driver circuit for a memory device, said word line driver circuit having a standby current limiting resistor connected between a power source and a base electrode of a word line driver transistor, said word line driver circuit including
    at least one active pull up circuit means for shunting said current limiting resistor.

2. A word line driver circuit as recited in claim 1, wherein said at least one active pull up circuit means is responsive to a change of conductive state of at least one input transistor.

3. A word line driver circuit as recited in claim 1, wherein said at least one active pull up circuit means is responsive to a change of conduction of a word line driver transistor.

4. A word line driver circuit for a memory device as recited in claim 1, wherein said memory device is a static random access memory device.

5. A word line driver circuit for a memory device having at least one word line driving bipolar transistor of a first conductivity type which has an emitter electrode connected to a word line of said memory device, a collector electrode and a base electrode and a standby power limiting resistor connected between a power source and said base electrode, said word line driver circuit including
    an active pull up circuit means shunting said standby power limiting resistor which is conductive when said at least one word line driving bipolar transistor is conductive.

6. A word line driver circuit as recited in claim 5, wherein said collector electrode of said at least one word line driving transistor is connected to said power source through a feedback resistor, and wherein said active pull up circuit means includes a bipolar transistor of a second conductivity type having a base electrode connected to a node between said at least one word line driving transistor and said feedback resistor.

7. A word line driver circuit as recited in claim 6, further including a diode connected between said base electrode and said collector electrode of said word line driver transistor.

8. A word line driver circuit as recited in claim 7, wherein said word line driver circuit includes a plurality of parallel connected input transistors, said word line driver circuit further including a further active pull up circuit means connected between said power source and said base electrode of said at least one word line driver bipolar transistor for shunting said standby power limiting resistor responsive to a change of conduction state of said plurality of parallel connected input transistors.

9. A word line driver circuit as recited in claim 8, wherein said further active pull up circuit means includes a Darlington connected pair of transistors.

10. A word line driver circuit as recited in claim 8, further including a diode connected between said base electrode of said word line driver transistor and said plurality of parallel connected input transistors.

11. A word line driver circuit as recited in claim 6, wherein said word line driver circuit includes a plurality of parallel connected input transistors, said word line driver circuit further including a further active pull up circuit means connected between said power source and said base electrode of said at least one work line driver bipolar transistor for shunting said standby power limiting resistor responsive to a change of conduction state of said plurality of parallel connected input transistors.

12. A word line driver circuit as recited in claim 11, wherein said further active pull up circuit means includes a Darlington connected part of transistors.

13. A word line driver circuit as recited in claim 11, further including a diode connected between said base electrode of said word line driver transistor and said plurality of parallel connected input transistors.

14. A word line driver circuit for a memory device as recited in claim 5, in which said memory device is a static random access memory device.

* * * * *